(12) United States Patent
Liu

(10) Patent No.: US 9,750,163 B2
(45) Date of Patent: Aug. 29, 2017

(54) THERMAL DISSIPATION SYSTEM FOR SERVER

(71) Applicants: HONGFUJIN PRECISION ELECTRONICS (TIANJIN) CO., LTD., Tianjin (CN); HON HAI PRECISION INDUSTRY CO., LTD., New Taipei (TW)

(72) Inventor: Feng-Kui Liu, Shenzhen (CN)

(73) Assignees: HONGFUJIN PRECISION ELECTRONICS (TIANJIN) CO., LTD., Tianjin (CN); HON HAI PRECISION INDUSTRY CO., LTD., New Taipei (TW)

( * ) Notice: Subject to any disclaimer, the term of this patent is extended or adjusted under 35 U.S.C. 154(b) by 4 days.

(21) Appl. No.: 14/852,815

(22) Filed: Sep. 14, 2015

(65) Prior Publication Data

US 2017/0055376 A1    Feb. 23, 2017

(30) Foreign Application Priority Data

Aug. 20, 2015    (CN) .......................... 2015 1 0513537

(51) Int. Cl.
    H05K 7/20    (2006.01)
(52) U.S. Cl.
    CPC ................ H05K 7/20718 (2013.01)
(58) Field of Classification Search
    USPC .............................. 361/679.46, 691; 700/276
    See application file for complete search history.

(56) References Cited

U.S. PATENT DOCUMENTS

| 7,620,480 | B2 * | 11/2009 | Patel ..................... G06F 1/206 361/695 |
| 2007/0074525 | A1 * | 4/2007 | Vinson ............... H05K 7/20745 62/259.2 |
| 2011/0203785 | A1 * | 8/2011 | Federspiel ............ G05D 22/02 165/200 |

* cited by examiner

*Primary Examiner* — Tuan T Dinh
*Assistant Examiner* — Mukund G Patel
(74) *Attorney, Agent, or Firm* — Steven Reiss

(57) ABSTRACT

A thermal dissipation system for a server includes a compressed air generating device, a compressed air transmission device, and a controller coupled to the compressed air generating device and the compressed air transmission device. The compressed air generating device includes at least one compressed air source for outputting compressed air. The compressed air transmission device is coupled to the compressed air generating device, and is configured to transmit the compressed air to a server, to make the temperature of air inside the server can be outputted with the compressed air. The controller is configured to detect the heat in the server through the compressed air transmission device, and control values of the pressure and airflow of the compressed air output from the compressed air generating device, according to the heat detected of the server. Therefore, the thermal dissipation system can output compressed air with higher pressure and greater airflow.

10 Claims, 5 Drawing Sheets

US 9,750,163 B2

THERMAL DISSIPATION SYSTEM FOR SERVER

FIELD

The subject matter herein generally relates to a thermal dissipation system for a server.

BACKGROUND

Heat dissipation of servers usually depends on fans or water-cooling, which will result in higher cost, greater noise, higher temperature of environment of server, and damage to hard disk drives.

BRIEF DESCRIPTION OF THE DRAWINGS

Implementations of the present technology will now be described, by way of example only, with reference to the attached figures.

DETAILED DESCRIPTION

Figure 1:
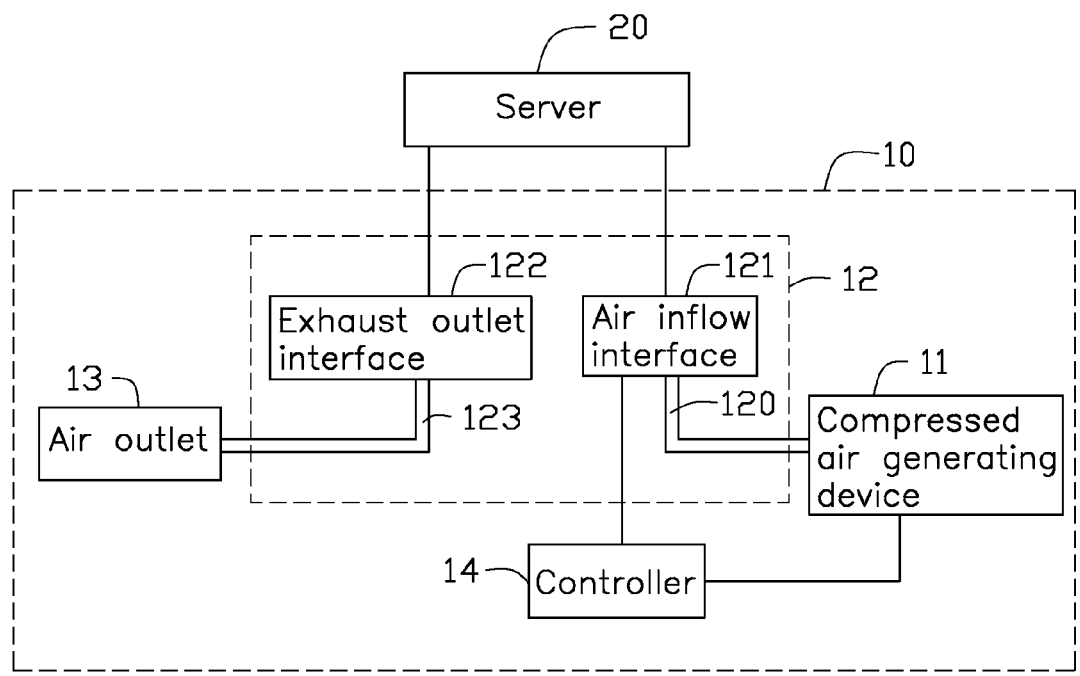
FIG. 1 is a diagrammatic diagram of an embodiment of a thermal dissipation system.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently coupled or releasably coupled. The term "comprising," when utilized, means "including, but not necessarily limited to"; it specifically indicates open-ended inclusion or membership in the so-described combination, group, series and the like.

The disclosure will now be described in relation to a thermal dissipation system.

Figure 2:
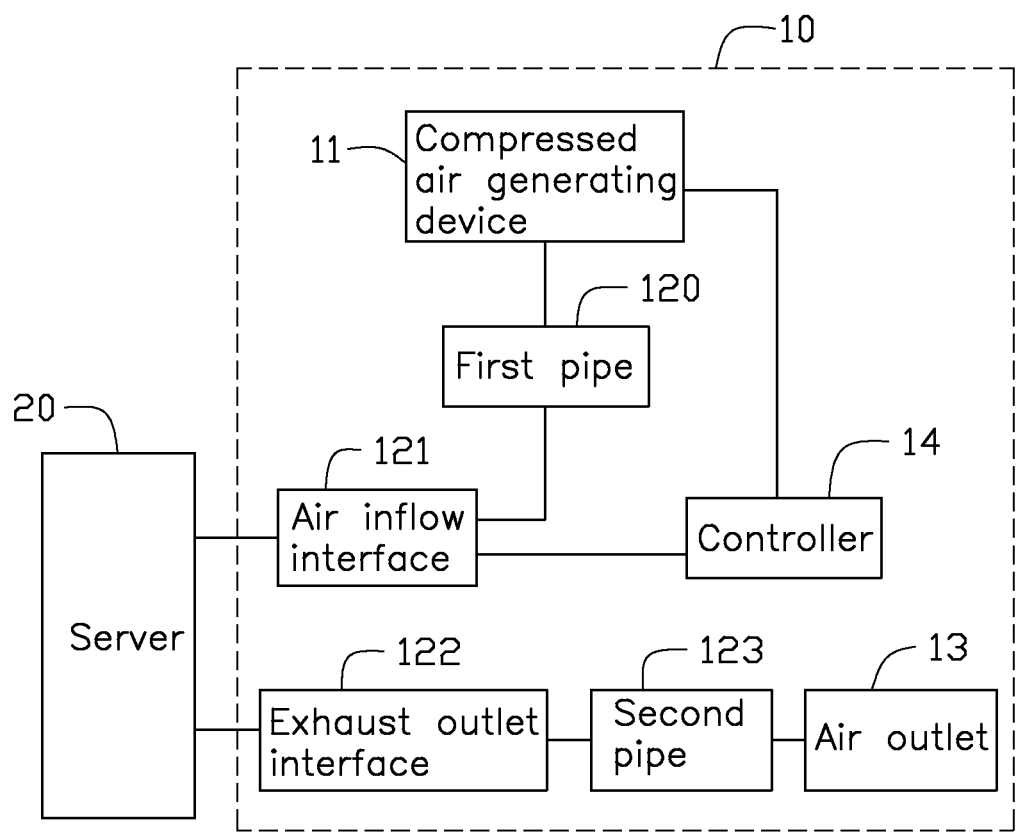
FIG. 2 is a block diagram of an embodiment of the thermal dissipation system.

FIG. 1 illustrates a diagrammatic diagram of an embodiment of a thermal dissipation system 10 for a server 20. FIG. 2 illustrates a block diagram of an embodiment of the thermal dissipation system 10 for the server 20. The thermal dissipation system 10 can include a compressed air generating device 11, a compressed air transmission device 12, an air outlet 13, and a controller 14. The compressed air transmission device 12 can include a first pipe 120, an air inflow interface 121, an exhaust outlet interface 122, and a second pipe 123. The air inflow interface 121 and the exhaust outlet interface 122 are coupled to the server 20.

In at least one embodiment, the air inflow interface 121 and the exhaust outlet interface 122 are standardized interfaces, for coupling to different type of servers. The compressed air generating device 11 is configured to output compressed air with steady pressure, and transmits the compressed air to the air inflow interface 121 through the first pipe 120. The air inflow interface 121 is configured to transmit the compressed air to the server 20, for dispersing heat in the server 20. The exhaust outlet interface 122 receives the compressed air carrying the heat from the server 20, and transmits the compressed air carrying the heat from the server 20 to the air outlet 13. In the embodiment, the air outlet 13 is set in outside, and is configured to output compressed air carrying the heat from the server 20 to the outside world. The first pipe 120 and the second pipe 123 are designing with totally-enclosed and streamlined, for decreasing wind resistance of the first pipe 120 and the second pipe 123.

Figure 3:
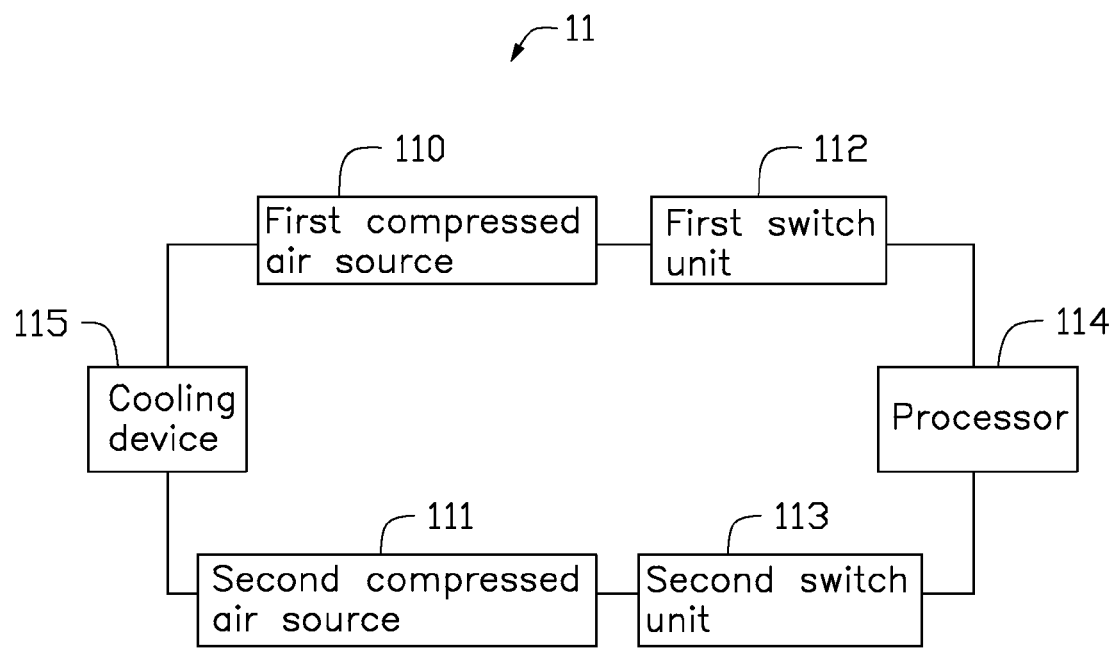
FIG. 3 is a block diagram of a first embodiment of a compressed air generating device of the thermal dissipation system of FIG. 1.

FIG. 3 is a block diagram of a first embodiment of the compressed air generating device 11. The compressed air generating device 11 comprises a first compressed air source 110, a second compressed air source 111, a first switch unit 112, a second switch unit 113, a processor 114, and a cooling device 115. The first switch unit 112 and the second switch unit 113 are coupled to the first compressed air source 110 and the second compressed air source 111 respectively. The processor 114 is coupled to the first switch unit 112 and the second switch unit 113. The cooling device 115 is coupled to the first compressed air source 110 and the second compressed air source 111. The processor 114 is configured to detecting whether the first compressed air source 110 or the second compressed air source 111 is operating. When the processor 114 detects the first compressed air source 110 does not operate, the processor 114 controls the first switch unit 112 coupled to the first compressed air source 110 to turn off, and controls the second switch unit 113 coupled to the second compressed air source 111 to turn on, to make the second compressed air source 111 to output compressed air. The cooling device 115 is coupled to the air inflow interface 121 through the first pipe 120, for cooling the compressed air from the first compressed air source 110 or the second compressed air source 111.

In the embodiment, each of the first switch unit 112 and the second switch unit 113 can be a switch component or combination of multiple switches components. The first compressed air source 110 and the second compressed air source 111 are independent compressed air station. The second compressed air source 111 can make a function of backup, when the first compressed air source 110 does not operate.

Figure 4:
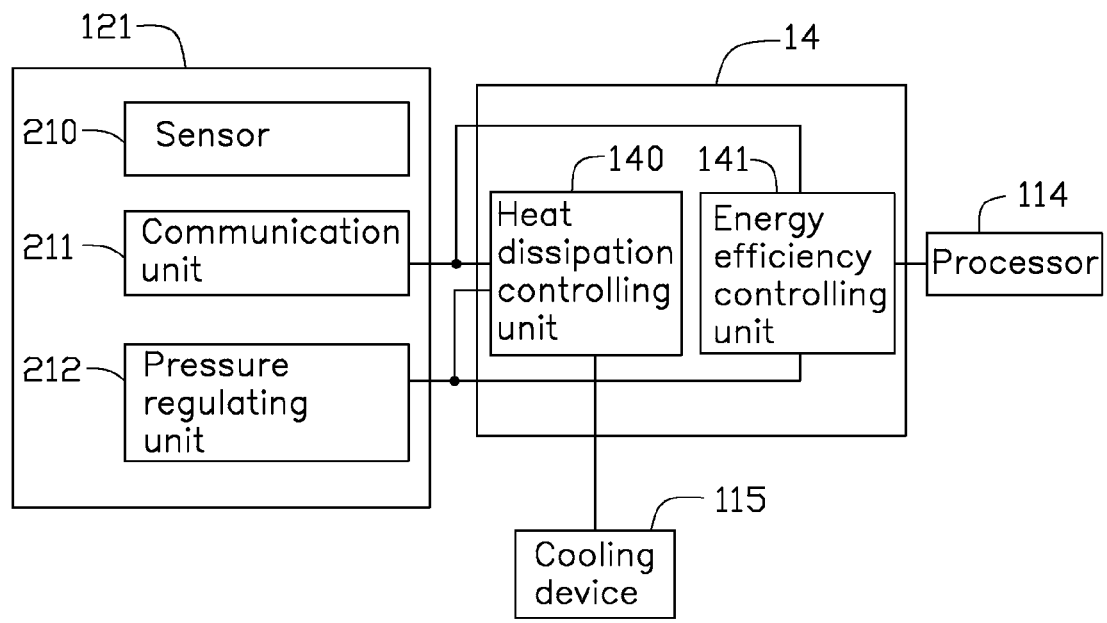
FIG. 4 is a block diagram of an embodiment of a controller of the thermal dissipation system for server is coupled to an air inflow interface, a processor and a cooling device of the compressed air generating device of the thermal dissipation system.

FIG. 4 is a block diagram of an embodiment of the controller 14 coupled to the air inflow interface 121, the processor 114 and the cooling device 115.

The air inflow interface 121 includes a sensor 210, a communication unit 211, and a pressure regulating unit 212. The sensor 210 is coupled to the cooling device 115, to receive the compressed air from the compressed air generating device 11, and transmit the compressed air to the server 20.

The controller 14 includes a heat dissipation controlling unit 140 and an energy efficiency controlling unit 141. The communication unit 211 and the pressure regulating unit 212 are coupled to the heat dissipation controlling unit 140 and an energy efficiency controlling unit 141 respectively. The heat dissipation controlling unit 140 is also coupled to the cooling device 115 of the compressed air generating device 11. The energy efficiency controlling unit 141 is also coupled to the processor 114 of the compressed air generating device 11.

The sensor 210 is configured to sense a temperature and humidity inside the server 20, and transmits the temperature and humidity inside the server 20 to the heat dissipation controlling unit 140 through the communication unit 211. When the temperature inside the server 20 is greater than a preset value, the heat dissipation controlling unit 140 controls the cooling device 115 of the compressed air generating device 11 to reduce the temperature of the compressed air.

The pressure regulating unit 212 is configured to pressure and airflow of the air inside the server 20, and adjusting the pressure and airflow of the air inside the server 20 according to a preset pressure reference value and an airflow reference value in the server 20.

The energy efficiency controlling unit 141 is configured to calculate pressure, airflow, and temperature inside the server 20, through the communication unit 211 and pressure regulating unit 212. The energy efficiency controlling unit 141 can adjust the pressure reference value and the airflow reference value set in the server 20, according to the pressure, airflow, and temperature calculated currently, and transmits the pressure reference value and the airflow reference value to the heat dissipation controlling unit 140. The heat dissipation controlling unit 140 can adjust the pressure reference value and the airflow reference value of the pressure regulating unit 212, according to the pressure reference value and the airflow reference value received from the energy efficiency controlling unit 141.

The energy efficiency controlling unit 141 is coupled to the processor 114 of the compressed air generating device 11, and detects the pressure and airflow inside the server 20 through the communication unit 211. The energy efficiency controlling unit 141 can also adjust a control parameter of the processor 114 according to the pressure and airflow inside the server 20 detected, to control the first or second compressed air source to output an adaptive pressure and airflow matching that of in the server 20, for dispersing the heat inside the server 20.

Figure 5:
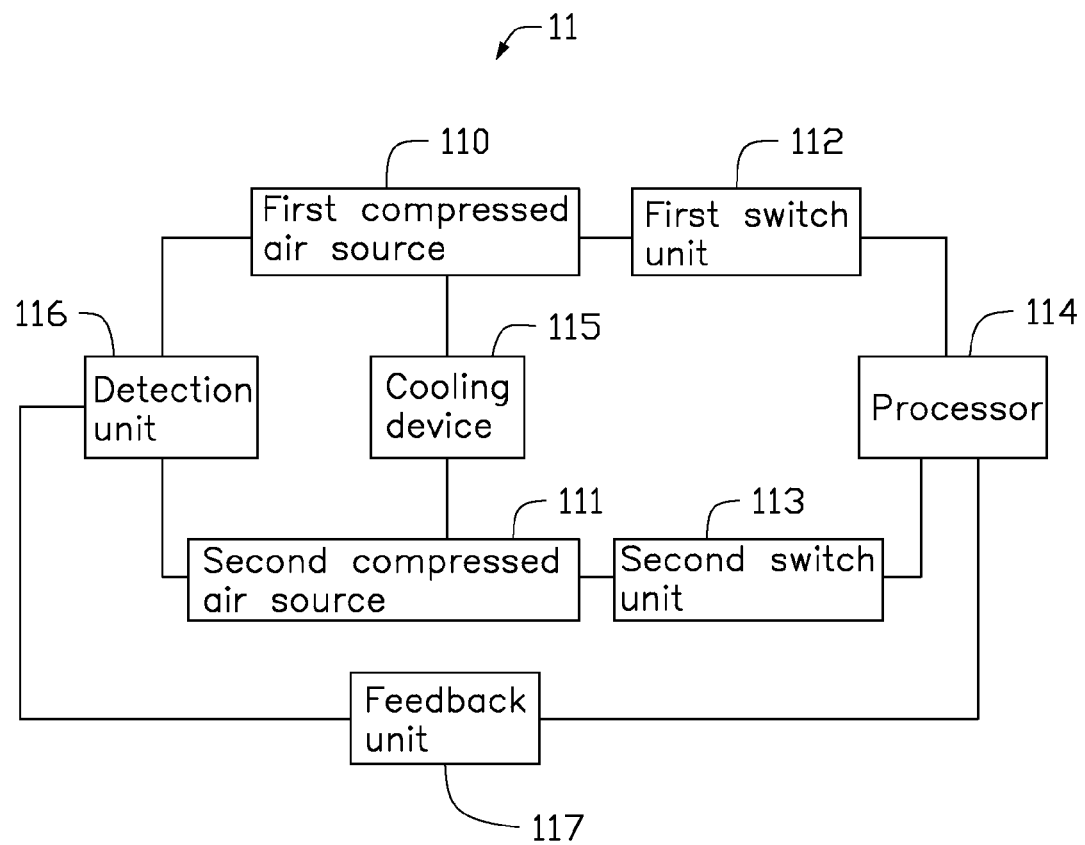
FIG. 5 is a block diagram of a second embodiment of the compressed air generating device of the thermal dissipation system of FIG. 1.

FIG. 5 is a block diagram of a second embodiment of the compressed air generating device 11 of the thermal dissipation system 10. In the embodiment, the compressed air generating device 11 also includes a detection unit 116 and a feedback unit 117. The detection unit 116 is coupled to the first compressed air source 110 and the second compressed air source 111, and is coupled to the processor 114 through the feedback unit 117. The detection unit 116 can detect the pressure and airflow of the compressed air from the first compressed air source 110 or the second compressed air source 111, and transmit a detection result to the processor 114 through the feedback unit 117. The processor 114 can adjust the pressure and airflow of the compressed air from the first compressed air source 110 or the second compressed air source 111 according to the detection result.

Therefore, the thermal dissipation system 10 can output compressed air with higher pressure and greater airflow through the compressed air generating device 11, to keep the environment of server from rising temperature, and can also reduce noise of environment. Hard disk drives in the server can also be avoided damaged by the vibration of fans.

While the disclosure has been described by way of example and in terms of the embodiment, it is to be understood that the disclosure is not limited thereto. On the contrary, it is intended to cover various modifications and similar arrangements as would be apparent to those skilled in the art. Therefore, the range of the appended claims should be accorded the broadest interpretation so as to encompass all such modifications and similar arrangements.

What is claimed is:

1. A thermal dissipation system for a server, the thermal dissipation system comprising:
    a compressed air generating device comprising first and second compressed air sources configured to output compressed air;
    a compressed air transmission device to coupled to the compressed air generating device and a server, and configured to transmit compressed air outputted by the compressed air generating device to the server;
    an air outlet coupled to the compressed air transmission device, and configured to enable release of air from within the server; and
    a controller coupled to the compressed air generating device and the compressed air transmission device, the controller configured to detect a temperature of air inside the server and to control the compressed air generating device to generate air pressure inside the server sufficient to cause air inside the server to be released through the air outlet,
    wherein the compressed air generating device comprises, a first switch unit coupled to the first compressed air source, and a processor coupled to the first switch unit;
    wherein when the first compressed air source does not operate, the processor controls the first switch unit to turn off, thereby the second compressed air source will output compressed air to the compressed air transmission device;
    wherein the compressed air generating device further comprises a second switch unit coupled to the second compressed air source, the processor coupled to the second switch unit; when the first compressed air source does not operate, the processor controls the second switch unit to turn on to make the second compressed air source output compressed air to the compressed air transmission device.

2. The thermal dissipation system of claim 1, wherein the compressed air transmission device comprising a first pipe, a second pipe, an air inflow interface, and an exhaust outlet interface, the air inflow interface and an exhaust outlet interface are coupled to the server, the first pipe is coupled between the compressed air generating device and the air inflow interface, the second pipe is coupled between the air outlet and exhaust outlet interface, the compressed air from compressed air generating device is output to the server through the first pipe and the air inflow interface, and the compressed air with the temperature of air inside the server is output to the air outlet through the second pipe and the exhaust outlet interface.

3. The thermal dissipation system of claim 2, wherein the air inflow interface comprises a sensor and a communication unit, the sensor is configured to sense temperature and humidity inside the server, and to transmit the temperature and humidity to the controller through the communication unit.

4. The thermal dissipation system of claim 3, wherein the air inflow interface comprises a pressure regulating unit, the pressure regulating unit is configured to detect the pressure and airflow of air inside the server, and to adjust the pressure and airflow of the air inside the server according to a preset reference value.

5. The thermal dissipation system of claim 4, wherein the air inflow interface and the exhaust outlet interface are standardized interfaces, to configured to couple to different type of servers.

6. The thermal dissipation system of claim 1, wherein the compressed air transmission device comprises a detection unit and a feedback unit, the detection unit is coupled to the first and second compressed air sources, the feedback unit is coupled to the processor, the feedback unit is configured to detect pressure and airflow of the compressed air from the first or second compressed air source, and compressed air to transmit a detection result to the processor through the feedback unit, the processor is configured to adjust the pressure and airflow of the compressed air from the first or second compressed air source according to the detection result.

7. The thermal dissipation system of claim 6, wherein the compressed air generating device comprises a cooling device, the cooling device is coupled to the first and second compressed air source, and is configured to cool the compressed air output from the first or second compressed air source.

8. The thermal dissipation system of claim 1, wherein the controller comprises a heat dissipation controlling unit coupled to the communication unit and the pressure regulating unit, and is configured to monitor temperature and humidity inside the server through the communication unit, to adjust the reference value of the pressure regulating unit, and when the pressure regulating unit cannot operate, the heat dissipation controlling unit initiates to adjust the pressure and airflow inside the server.

9. The thermal dissipation system of claim 8, wherein the controller further comprises an energy efficiency controlling unit coupled to the communication unit and the pressure regulating unit, and is configured to calculates pressure, airflow, and temperature inside the server through the communication unit and the pressure regulating unit and output a calculation result, for adjusting a pressure reference value and an airflow reference value according to the calculation result, the heat dissipation controlling unit is configured to receives the pressure reference value and the airflow reference value to adjust the reference value of the pressure regulating unit.

10. The thermal dissipation system of claim 9, wherein the energy efficiency controlling unit is coupled to the compressed air generating device, and is configured to detect the pressure and airflow inside the server through the communication unit and output a detection result, for adjusting the pressure and airflow of the compressed air output from the compressed air generating device according to the detection result.

\* \* \* \* \*